(12) United States Patent
Lee

(10) Patent No.: US 7,381,274 B2
(45) Date of Patent: Jun. 3, 2008

(54) GAS VALVE ASSEMBLY AND APPARATUS USING THE SAME

(75) Inventor: Sang-Gon Lee, Gyeonggi-do (KR)

(73) Assignee: Jusung Engineering Col, Ltd., Kwangju-shi (KR)

( * ) Notice: Subject to any disclaimer, the term of this patent is extended or adjusted under 35 U.S.C. 154(b) by 322 days.

(21) Appl. No.: 10/870,598

(22) Filed: Jun. 16, 2004

(65) Prior Publication Data

US 2004/0255858 A1    Dec. 23, 2004

(30) Foreign Application Priority Data

Jun. 17, 2003   (KR) ..................... 10-2003-0039028

(51) Int. Cl.
*C23C 16/455* (2006.01)
*C23F 1/00* (2006.01)
*H01L 21/306* (2006.01)
*C23C 16/44* (2006.01)

(52) U.S. Cl. .............. 118/715; 156/345.33; 156/345.34
(58) Field of Classification Search ..................... None
See application file for complete search history.

(56) References Cited

U.S. PATENT DOCUMENTS

| | | | | | |
|---|---|---|---|---|---|
| 4,054,293 | A | * | 10/1977 | Hoeg et al. .................. | 277/410 |
| 4,671,679 | A | | 6/1987 | Heshmat | |
| 4,792,113 | A | * | 12/1988 | Eidsmore ..................... | 251/65 |
| 5,359,148 | A | * | 10/1994 | Okase et al. ................. | 118/724 |
| 5,421,892 | A | * | 6/1995 | Miyagi ........................ | 118/724 |
| 5,450,169 | A | * | 9/1995 | Hart et al. ................... | 399/104 |
| 5,659,445 | A | * | 8/1997 | Yoshida et al. .......... | 360/98.07 |
| 5,676,472 | A | * | 10/1997 | Solomon et al. .......... | 384/607 |
| 5,772,833 | A | * | 6/1998 | Inazawa et al. ........ | 156/345.47 |
| 5,775,169 | A | * | 7/1998 | Solomon et al. ......... | 74/490.01 |
| 5,820,104 | A | * | 10/1998 | Koyano et al. ............. | 251/326 |
| 5,826,885 | A | * | 10/1998 | Helgeland ................... | 277/302 |
| 5,954,342 | A | * | 9/1999 | Mikhalev et al. .......... | 277/410 |
| 5,955,934 | A | * | 9/1999 | Raj ............................ | 335/277 |
| 5,969,589 | A | * | 10/1999 | Raj ............................ | 335/277 |
| 6,030,457 | A | * | 2/2000 | Shimazu et al. ............ | 118/715 |
| 6,119,553 | A | * | 9/2000 | Yamagishi et al. ........... | 74/640 |
| 6,192,603 | B1 | * | 2/2001 | Seita ........................... | 34/559 |
| 6,235,121 | B1 | * | 5/2001 | Honma et al. .............. | 118/730 |
| 6,406,362 | B1 | | 6/2002 | Yednak, III et al. | |
| 6,461,484 | B2 | * | 10/2002 | Yo et al. ............... | 204/192.12 |

(Continued)

FOREIGN PATENT DOCUMENTS

JP    2002-280374    9/2002

OTHER PUBLICATIONS

English translation of JP2002-280374.

*Primary Examiner*—Rudy Zervigon
(74) *Attorney, Agent, or Firm*—Marger Johnson & McCollom PC

(57) ABSTRACT

A gas valve assembly for a deposition apparatus includes: a driving shaft including a plurality of gas supply paths therein; a housing surrounding the driving shaft and including a plurality of through holes therein; a plurality of magnetic seal pairs between the driving shaft and the housing, the plurality of magnetic seal pairs including a magnetic fluid; and a leakage-preventing means between the driving shaft and the housing, the leakage-preventing means preventing a leakage of the magnetic fluid.

12 Claims, 7 Drawing Sheets

U.S. PATENT DOCUMENTS 6,616,816 B2 * 9/2003 Sakai .................. 204/192.1
6,689,221 B2 * 2/2004 Ryding et al. ............. 118/730
6,728,989 B2   5/2004 Lerner et al.
6,772,710 B2 * 8/2004 Lee .................... 118/723 HC
2001/0003271 A1 * 6/2001 Otsuki ................ 118/723.001
2003/0044533 A1 * 3/2003 Lee .................... 427/255.28
2003/0094773 A1   5/2003 Lerner
2004/0255858 A1 * 12/2004 Lee ........................ 118/715

* cited by examiner

GAS VALVE ASSEMBLY AND APPARATUS USING THE SAME

The present invention claims the benefit of Korean Patent Application No. 2003-39028 filed in Korea on Jun. 17, 2003, which is hereby incorporated by reference.

BACKGROUND OF THE INVENTION

Field of the Invention

The present invention relates to a gas valve assembly for an atomic layer deposition apparatus, and more particularly, to a gas valve assembly having a magnetic seal.

DISCUSSION OF THE RELATED ART

In general, a semiconductor device or a liquid crystal display (LCD) device is formed through a fabricating process for a substrate including a deposition step of a thin film, an etching step and a cleaning step. As the substrate, a wafer may be used for a semiconductor device while a glass substrate may be used for an LCD device.

Methods of forming a thin film may be classified into a physical vapor deposition (PVD) method using a physical impact and a chemical vapor deposition (CVD) method using a chemical reaction. Since a thin film by a CVD method has superiority in uniformity and step coverage to a thin film by a PVD method, a CVD method has been widely used for a thin film. A PVD method includes a sputtering method and a CVD method includes an atmospheric pressure chemical vapor deposition (APCVD) method, a low pressure chemical vapor deposition (LPCVD) method and a plasma enhanced chemical vapor deposition (PECVD) method. Among various CVD methods, a PECVD method is commonly used because of its low process temperature and high deposition speed.

Recently, an atomic layer deposition (ALD) method has been suggested. Since a thin film formed by an ALD method has excellent property in uniformity and step coverage, the ALD method is used for a thin film requiring fine patterns such as a gate insulating layer, a dielectric layer for a capacitor and a diffusion barrier layer. In an ALD method, since source gases react just at a surface of a substrate, a thin film is deposited for a single supply period of source gases to have a constant thickness. Accordingly, a thickness of a resultant thin film may be finely controlled by the repetition number of supply period of the source gases.

For example, a tin film of a chemical compound A+B may be formed by an ALD method using two source materials A and B. After loading a substrate in a chamber, the chamber is closed and evacuated. Next, a source material A is injected into the chamber and adsorbed onto the substrate to form a first layer. Next, a purge gas such as argon (Ar) and nitrogen (N2) is injected into the chamber. The purge gas removes a residual source material A. After the purging step, a source material B is injected into the chamber. The source material B chemically reacts with the source material A of the first layer, thereby forming a second layer of a compound A+B. Next, a purge gas is injected into the chamber and removes a residual source material B. The above steps of injecting the source material A, purging, injecting the source material B and purging constitute a single deposition cycle for a single atomic layer of a compound A+B. A thin film of the compound A+B having a desired thickness is obtained by repeating the single deposition cycle.

However, since an ALD apparatus includes a plurality of injecting pipes and a plurality of valves adjusting the plurality of injecting pipes, a large installation area is required. In addition, since the single deposition cycle is repeated several times to several hundreds times for a thin film having a desired thickness, the plurality of valves operate ON/OFF more than several hundreds times per one substrate. Accordingly, after a process of forming a thin film is performed for the several hundreds substrates, a life span of the plurality of valves may be shortened.

SUMMARY OF THE INVENTION

Accordingly, the present invention is directed to a gas valve assembly for an atomic layer deposition apparatus that substantially obviates one or more of the problems due to limitations and disadvantages of the related art.

An object of the present invention is to provide a gas valve assembly having a magnetic seal.

Another object of the present invention is to provide a gas valve assembly where a leakage of a magnetic fluid is prevented.

Another object of the present invention is to provide an atomic layer deposition apparatus using a gas assembly where a contamination of chamber due to a leakage of a magnetic fluid is prevented.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a gas valve assembly for a deposition apparatus includes: a driving shaft including a plurality of gas supply paths therein; a housing surrounding the driving shaft and including a plurality of through holes therein; a plurality of magnetic seal pairs between the driving shaft and the housing, the plurality of magnetic seal pairs including a magnetic fluid; and a leakage-preventing means between the driving shaft and the housing, the leakage-preventing means preventing a leakage of the magnetic fluid.

In another aspect, an atomic layer deposition apparatus includes: a chamber; a gas valve assembly on the chamber, comprising: a driving shaft including a plurality of gas supply paths therein; a housing surrounding the driving shaft and including a plurality of through holes therein; a plurality of magnetic seal pairs between the driving shaft and the housing, the plurality of magnetic seal pairs including a magnetic fluid; and a leakage-preventing means between the driving shaft and the housing, the leakage-preventing means preventing a leakage of the magnetic fluid into the chamber; and a gas supplying unit supplying a plurality of source gases to and connected to the gas valve assembly.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 1:
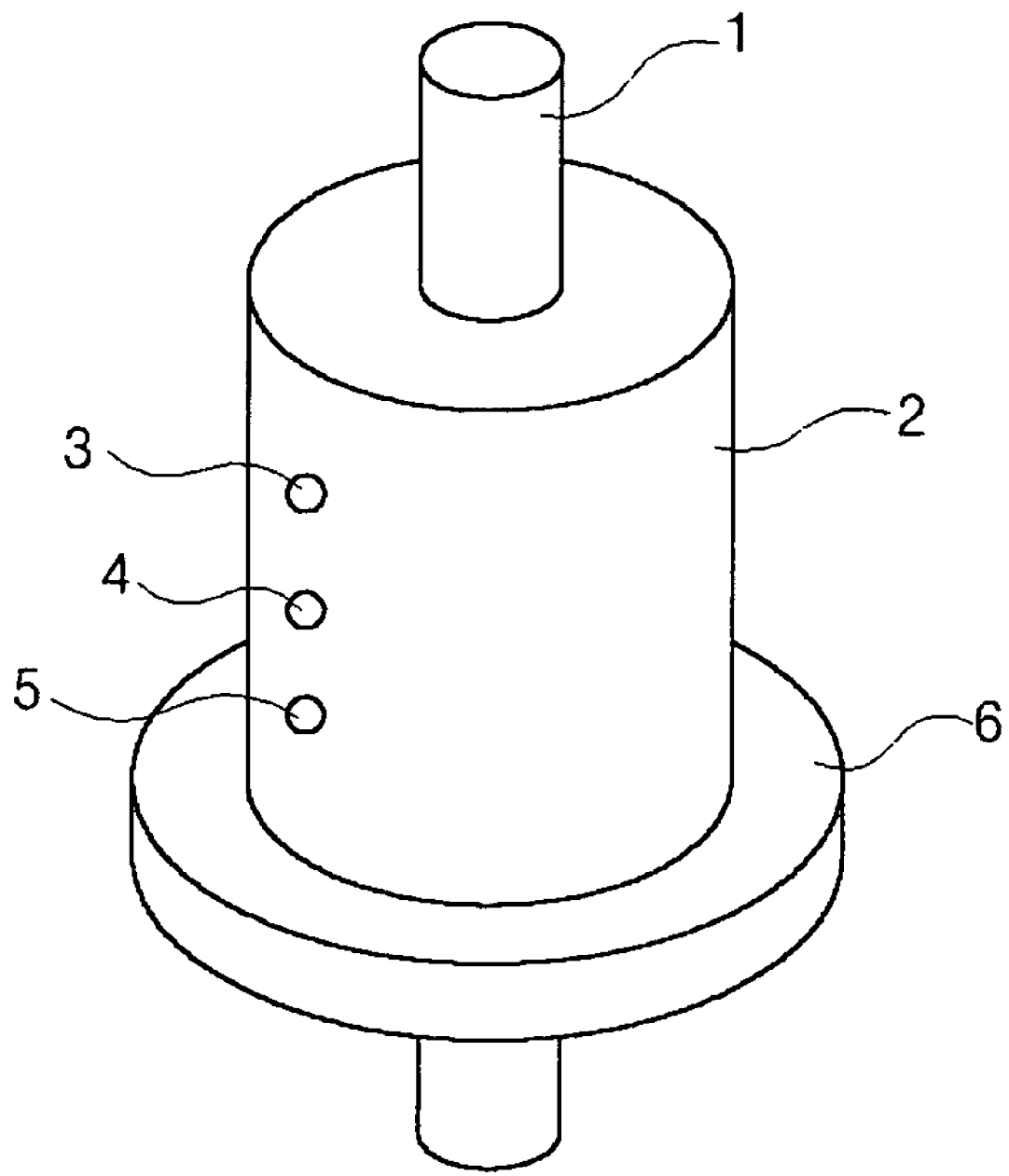
FIG. 1 is a schematic perspective view of a gas assembly for an atomic layer deposition apparatus according to an embodiment of the present invention.
Figure 2:
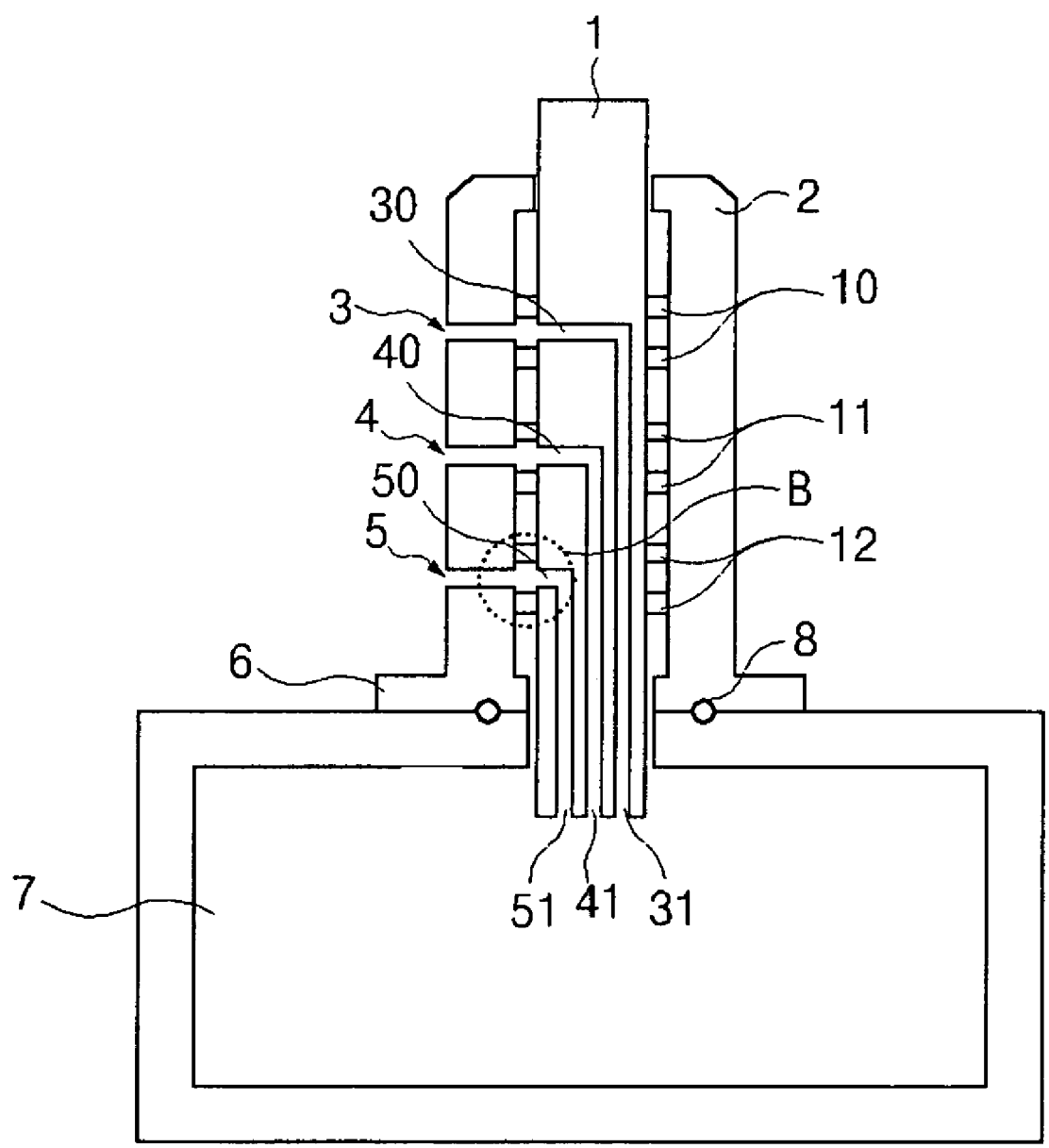
FIG. 2 is a schematic cross-sectional view of an atomic layer deposition apparatus having a gas assembly according to an embodiment of the present invention.

FIG. 1 is a schematic perspective view of a gas assembly for an atomic layer deposition apparatus according to an embodiment of the present invention, and FIG. 2 is a schematic cross-sectional view of an atomic layer deposition apparatus having a gas assembly according to an embodiment of the present invention.

In FIGS. 1 and 2, a gas assembly includes a driving shaft 1, a housing 2 surrounding the driving shaft 1 and a flange 6. The driving shaft 1 rotates using a power supplied from a driving unit (not shown) and first, second and third gas supply paths 30, 40 and 50 may be formed in the driving shaft 1. In addition, first, second and third through holes 3, 4 and 5 may be formed in a sidewall of the housing 2. The flange 6 may be combined to a chamber 7 of the atomic layer deposition (ALD) apparatus using a combination means such as a bolt. First, second and third magnetic seal pairs 10, 11 and 12 of a ring shape may be interposed between the driving shaft 1 and the housing 2. The first, second and third magnetic seal pairs 10, 20 and 30 between the driving shaft 1 and the housing 2 function as a seal for high vacuum of the chamber 7 and as a bearing for rotation of the driving shaft 1. An output end of the first through hole 3 and an input end of the first gas supply path 30 are disposed between the first magnetic seal pair 10. Similarly, an output end of the second through hole 4 and an input end of the second gas supply path 40 are disposed between the second magnetic seal pair 11, and an output end of the third through hole 5 and an input end of the third gas supply path 50 are disposed between the third magnetic seal pair 12. A source gas 3, a reaction gas and a purge gas may be supplied to the first, second and third through holes 3, 4 and 5, respectively. The number of through holes may vary in another embodiment according to a process. An O-ring 8 may be interposed between the flange 6 and the chamber 7 for sealing.

The gas supplied to the through hole 3, 4 and 5 may be diffused into a space surrounded by the driving shaft 1, the housing 2 and the magnetic seal pair 10, 11 and 12, and transferred to the gas supply path 30, 40 and 50. Then, the gas is injected into the chamber 7 through output ends 31,41 and 51 at the other end of the gas supply path 30, 40 and 50.

For convenience, the input ends of the first, second and third gas supply paths 30, 40 and 50 are shown to make a single vertical line in FIG. 2. In a ALD apparatus, the input ends of the first, second and third gas supply paths 30, 40 and 50 may be dispersively disposed not to make a single vertical line for controlling a period and an amount of supplied source gas, reaction gas and purge gas. In the ALD apparatus having dispersively disposed input ends of the first, second and third gas supply paths 30, 40 and 50, gas supply may be controlled independently. For example, injection of the reactive gas and the purge gas may be cut off when the source gas is injected, or injection of the source gas and the purge gas may be cut off when the reactive gas is injected. In addition, although the number of input ends of each gas supply path 30, 40 and 50 is one in FIG. 2, the number of input ends of each gas supply path 30, 40 and 50 may be changed for superior injection of the gas.

Figure 3:
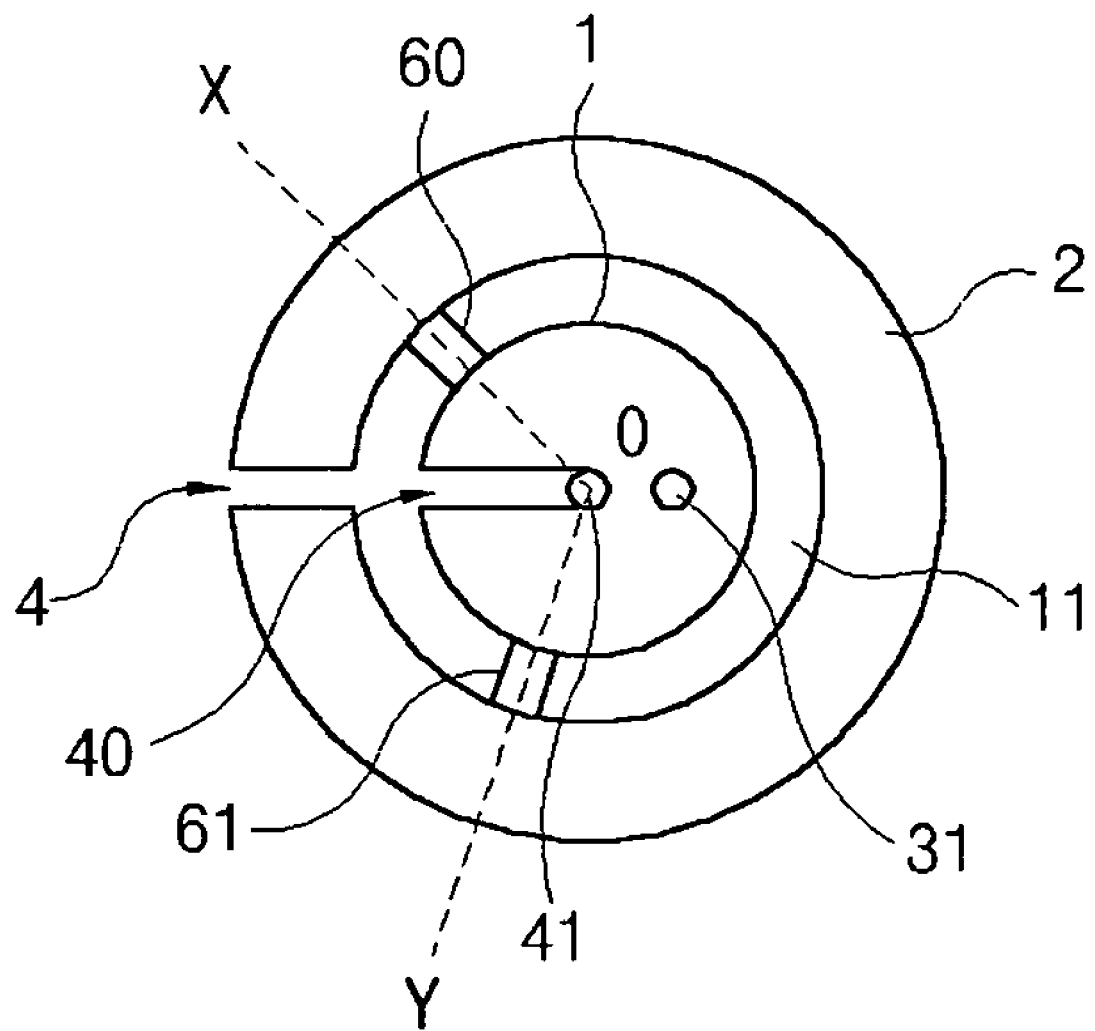
FIG. 3 is a schematic cross-sectional view of a gas assembly according to an embodiment of the present invention.

FIG. 3 is a schematic cross-sectional view of a gas assembly according to an embodiment of the present invention.

In FIG. 3, a gas supplied to the second through hole 4 may be diffused into a space surrounded by the driving shaft 1, the housing 2 and the second magnetic seal pair 11, and transferred to the second gas supply path 40. The space is divided into two portions by first and second separating means 60 and 61. A first portion has an angle XOY between the first and second separating means 60 and 61 with respect to a center of the driving shaft 1 and may be filled with the gas supplied to the second through hole 4. Both ends of the first and second separating means 60 and 61 may contact the driving shaft 1 and the housing 2, respectively, to prevent a leakage of the gas into the other portion.

The input end of the second gas supply path 40 rotates according to rotation of the driving shaft 1. While the input end of the second gas supply path 40 is disposed in the first portion, the gas supplied to the second through hole 4 may be injected into the chamber 7 through the second gas supply path 40. In addition, while the input end of the second gas supply path 40 is disposed in the second portion, injection of the gas supplied to the second through hole 40 into the chamber 7 may be cut off. Similarly, the gases supplied to the first and third through holes 3 and 5 are controlled by rotation of the driving shaft 1. The supply times and the supply periods for the gases are different from each other, and each supply time and each supply period may be adjusted by the angle between the first and second separating means 60 and 61 and an angular velocity of the driving shaft 1.

The number of the gas supply paths and the arrangement of the separating means may be variously changed in another embodiment. In addition, the gas valve assembly may further include an electric signal unit and an ON/OFF unit of valve for adjusting the supply time and the supply period of the gas in another embodiment.

Figure 4:
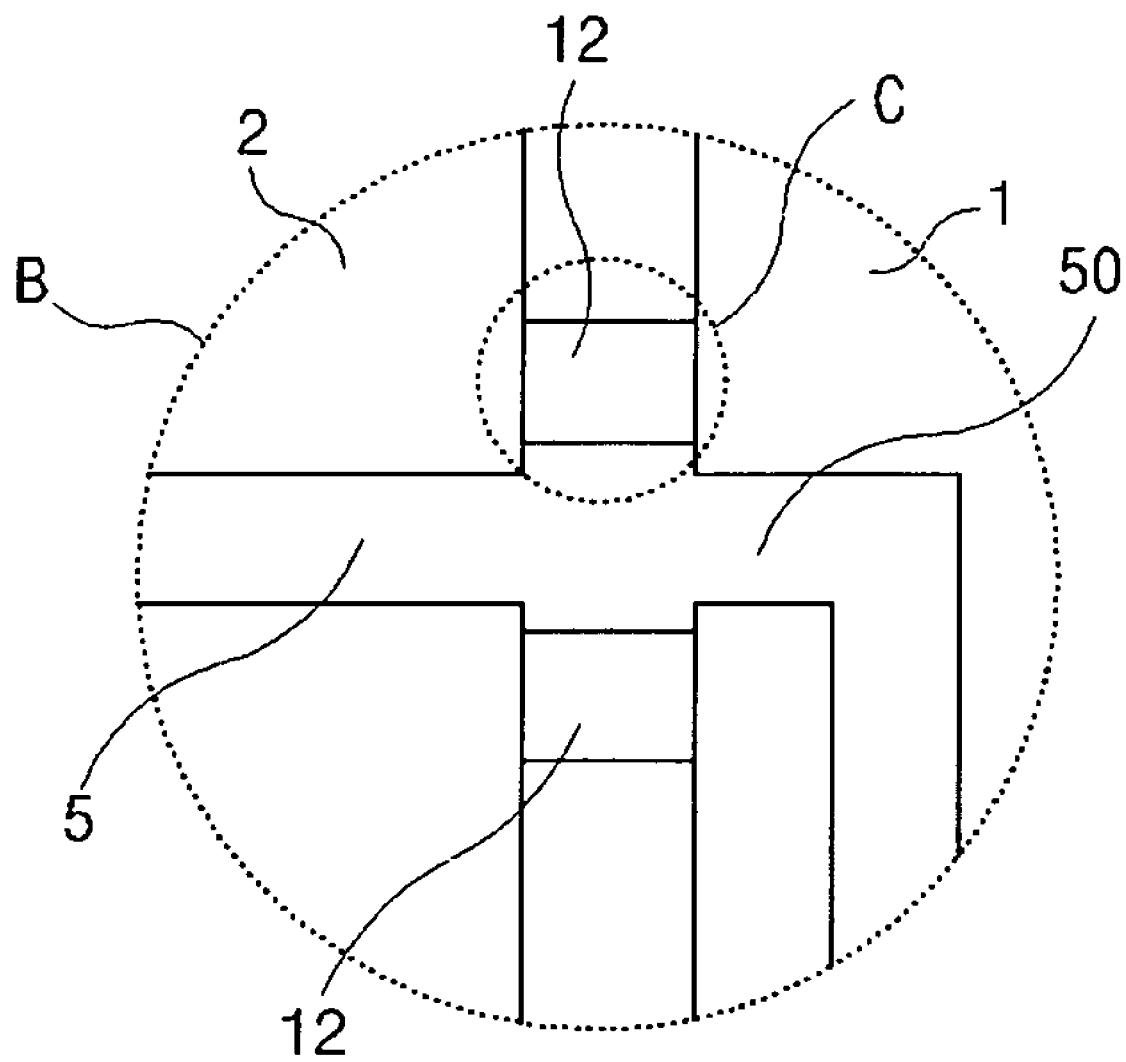
FIG. 4 is a magnified view of a portion "B" of FIG. 2.
Figure 5:
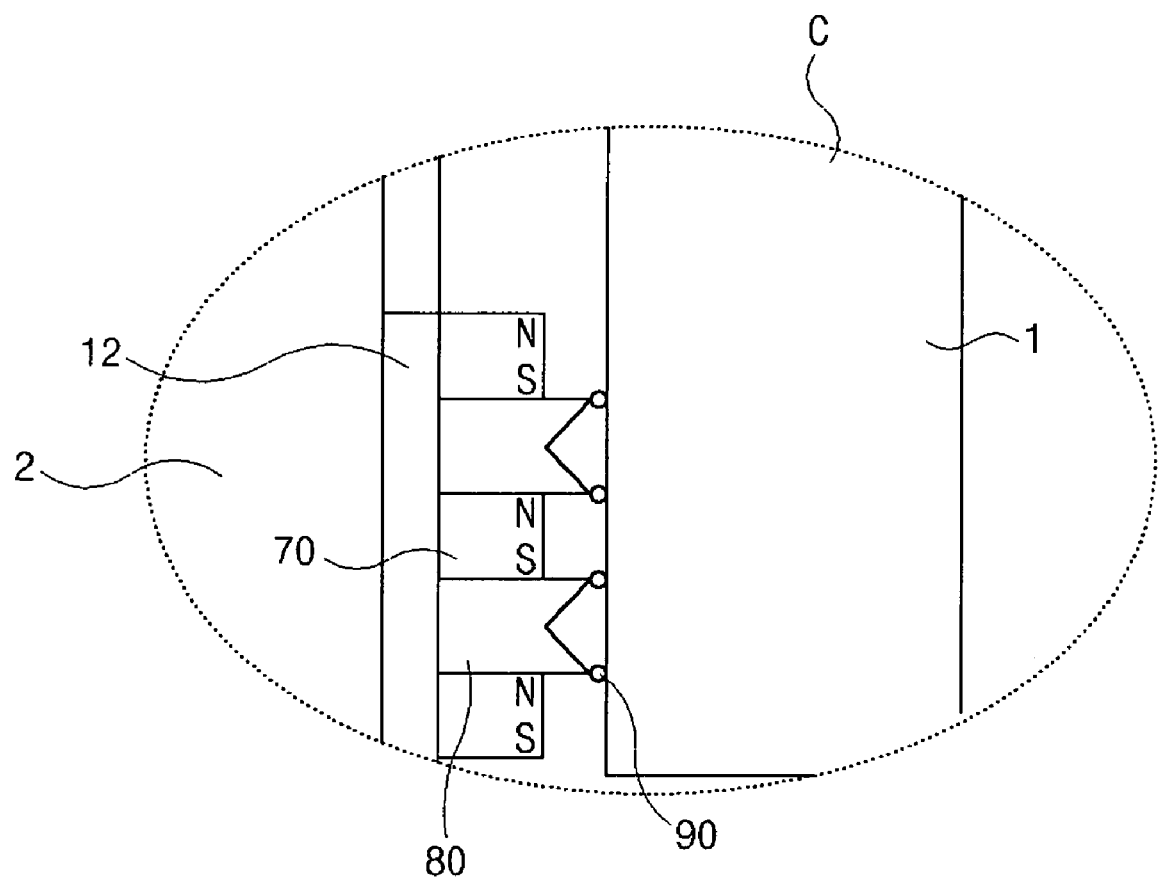
FIG. 5 is a magnified view of a portion "C" of FIG. 4.

FIG. 4 is a magnified view of a portion "B" of FIG. 2 and FIG. 5 is a magnified view of a portion "C" of FIG. 4.

In FIG. 4, the output end of the second through hole 5 in the housing 2 and the input end of the second gas supply path 50 in the driving shaft 1 are disposed between the second magnetic seal pair 12.

A magnetic seal is a liquid O-ring using a magnetic fluid that keeps a specific shape by a magnetic field. The magnetic fluid may be formed by stabilizing and dispersing a magnetic powder in a liquid as colloid and adding a surfactant for preventing precipitation and coagulation. Since fluidity and viscosity of the magnetic fluid are adjusted promptly and reversibly by a magnetic field, the magnetic fluid is used for a shaft seal and a vacuum seal. In addition, since the magnetic powder in the magnetic fluid includes ultra fine particles having a size of about 0.01 µm to about 0.02 µm, a Brownian movement occurs in the magnetic powder. Accordingly, concentration of the magnetic powder in the magnetic fluid is kept uniformly even when a magnetic field, a gravity and a centrifugal force are applied to the magnetic fluid from exterior. As a result, the magnetic fluid has an excellent sealing property and generation of particles due to friction between driving means is prevented.

In FIG. 5, a plurality of permanent magnets 70 and a plurality of ball beads 80 are formed on an inner surface of the housing 2. The plurality of permanent magnets 70 alternate with the plurality of ball beads 80. An acute portion is formed at an end of each ball bead 80. When a magnetic fluid 90 is injected into the acute portion of each ball bead 80, the magnetic fluid 90 is conglomerated at the acute portion due to a magnetic field of each permanent magnet 70 and a viscosity of the magnetic fluid 90 itself. Accordingly, the magnetic fluid 90 fills a gap between the acute portion and the driving shaft 1 and forms a magnetic seal 12 of a ring shape. As shown in FIG. 5, for example, two ball beads 80 may include four acute portions and four magnetic seals of a ring shape may be formed at four acute portions by injecting a magnetic fluid 90.

However, since a gas supplied to the through hole directly contacts the magnetic fluid, the solvent of the magnetic fluid may be volatilized and the magnetic powder such as ferrous oxide and manganese oxide may be dispersed into the chamber. As the semiconductor device becomes fine, the volatilized solvent and the dispersed magnetic powder deteriorate property of the semiconductor device more severely. In addition, since the magnetic fluid is pressurized by pressure difference between the chamber of high vacuum and the supplied gas, the magnetic fluid may be deteriorated such that the magnetic fluid is directly injected into the chamber. The directly injected magnetic fluid may function as a contamination source to generate particles in the chamber.

Figure 6:
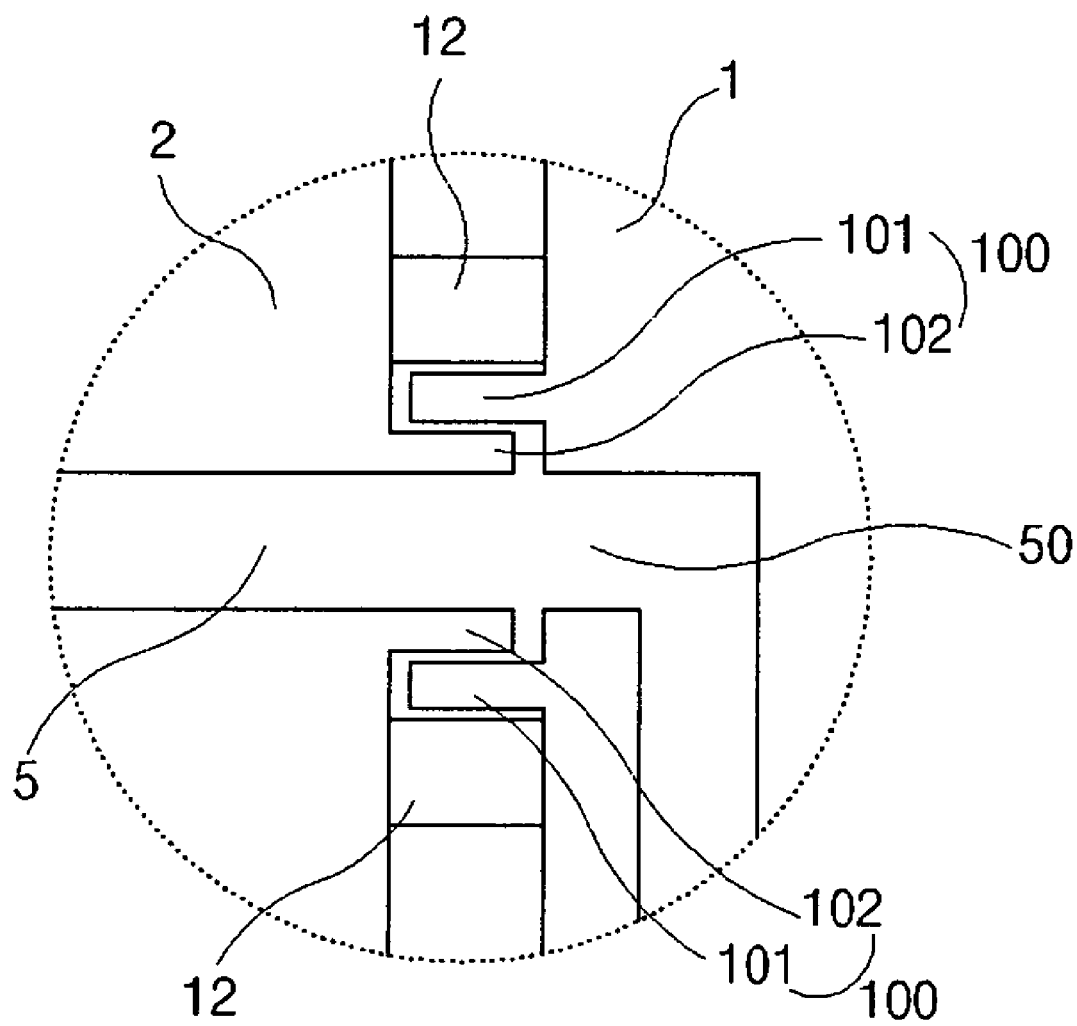
FIG. 6 is a schematic cross-sectional view of a gas valve assembly according to another embodiment of the present invention.

To improve these disadvantages, a gas valve assembly including a leakage-preventing means is suggested. FIG. 6 is a schematic cross-sectional view of a gas valve assembly according to another embodiment of the present invention.

In FIG. 6, the second through hole 5 in the housing 2 and the second gas supply path 50 in the driving shaft 1 are disposed between the second magnetic seal pair 12. Moreover, a labyrinth seal pair 100 as a leakage-preventing means is formed inside the second magnetic seal pair 12 for preventing a leakage of the magnetic fluid. Accordingly, one of the labyrinth seal pair 100 is formed between one of the magnetic seal pair 12 and a gas passage from the output end of the second through hole 5 to the input end of the second gas supply path 50. Due to the labyrinth seal pair 100, the gas supplied to the second through hole 5 does not directly contact the magnetic fluid of the second magnetic seal pair 12 and the pressure of supplying the gas does not directly affect the second magnetic seal pair 12.

In the labyrinth seal pair 100, a gas passes through a long and narrow gap. Since the labyrinth seal pair 100 has a ring shape, the gap constitutes a winding hole connecting the second magnetic seal pair 12 and a gas passage from the second through hole 5 to the second gas supply path 50. In addition, since the gap is winding, a length of the winding hole may be greater than a thickness of the labyrinth seal pair 100. Although the total pressure difference between both ends of the labyrinth seal pair 100 is not changed, a gradient of pressure per unit length is reduced. Accordingly, a gas seldom passes through the labyrinth seal pair 100, thereby preventing a direct contact between the gas and the magnetic seal pair 12 and a leakage of the magnetic fluid.

When the gas flows along a gas passage from the output end of the second through hole 5 to the input end of the second gas supply path 50, the labyrinth seal pair 100 is disposed to surround the gas passage inside the magnetic seal pair 12. The one of labyrinth seal pair 100 includes first and second protrusions 101 and 102 having a ring shape. The first and second protrusions 101 and 102 extend from the driving shaft 1 and the housing 2, respectively. In addition, the first and second protrusions 101 and 102 are disposed to alternate with each other and not to contact each other. For example, an inner surface of the first protrusion 101 faces an outer surface of the second protrusion 102 with the gas passage as a reference. When the first and second protrusions 101 and 102 contact each other, particles may be generated by friction and the particles may function as a contamination source in the chamber. Accordingly, the first and second protrusions 101 and 102 may be formed to have a narrowest gap within a limit of direct contact.

Even though not shown in FIG. 6, the labyrinth seal pair 100 may be formed to correspond to each magnetic seal pair. In addition, although the labyrinth seal pair 100 includes two protrusions in FIG. 6, a plurality of protrusions may be formed in a labyrinth seal pair in another embodiment.

Figure 7:
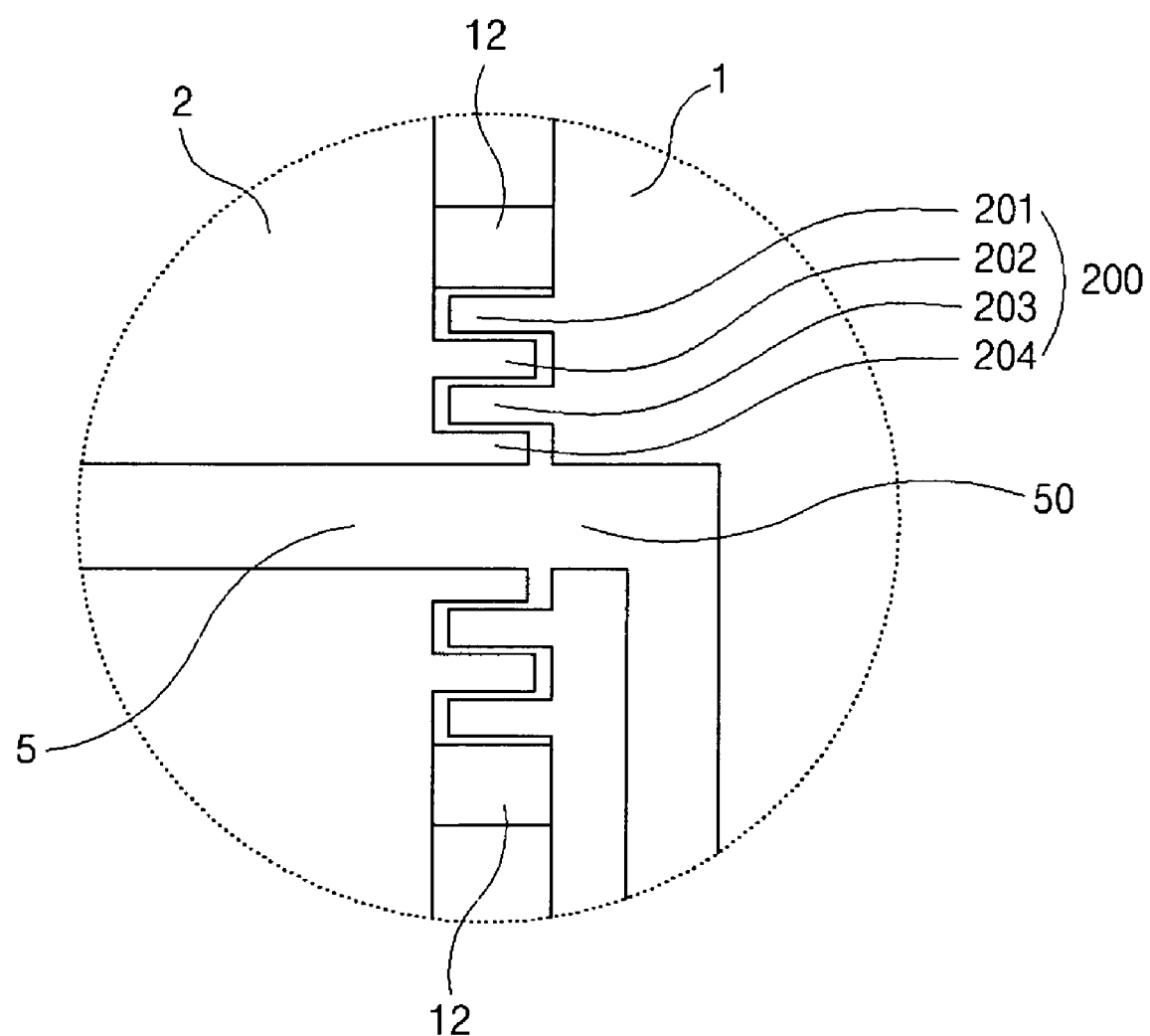
FIG. 7 is a schematic cross-sectional view of a gas valve assembly according to another embodiment of the present invention.

FIG. 7 is a schematic cross-sectional view of a gas valve assembly according to another embodiment of the present invention.

In FIG. 7, the second through hole 5 in the housing 2 and the second gas supply path 50 in the driving shaft 1 are disposed between the second magnetic seal pair 12. In addition, a labyrinth seal pair 200 is formed inside the second magnetic seal pair 12 for preventing leakage of the magnetic fluid. Accordingly, one of the labyrinth seal pair 200 is formed between one of the magnetic seal pair 12 and a gas passage from the output end of the second through hole 5 to the input end of the second gas supply path 50. Due to the labyrinth seal pair 200, the gas supplied to the second through hole 5 does not directly contact the magnetic fluid of the second magnetic seal pair 12 and the pressure of supplying the gas does not directly affect the second magnetic seal pair 12.

When the gas flows along a gas passage from the output end of the second through hole 5 to the input end of the second gas supply path 50, the labyrinth seal pair 200 is disposed to surround the gas passage inside the magnetic seal pair 12. The one of labyrinth seal pair 200 includes first, second, third and fourth protrusions 201, 202, 203 and 204 having a ring shape. The first and third protrusions 201 and 203 extend from the driving shaft 1, and the second and fourth protrusions 202 and 204 extend from the housing 2. The first, second, third and fourth protrusions 201, 202, 203 and 204 are disposed to alternate with one another like a gear. In addition, the first, second, third and fourth protrusions 201, 202, 203 and 204 do not contact one another. For example, the second protrusion 202 is interposed between the first and third protrusions 201 and 203, and the third protrusion 203 is interposed between the second and fourth protrusions 202 and 204. If the first, second, third and fourth protrusions 201, 202, 203 and 204 contact one another, particles may be generated by friction and the particles may function as a contamination source in the chamber. Accordingly, the first, second, third and fourth protrusions 201, 202, 203 and 204 may be formed to have a narrowest gap within a limit of direct contact.

Although the labyrinth seal pair 200 includes four protrusions in FIG. 7, the labyrinth seal pair may include a plurality of protrusions more than four in another embodiment. In addition, although the upper and lower portions of the labyrinth seal pair 200 include the same number of protrusions in FIG. 7, the upper and lower portions of the labyrinth seal pair 200 may include the different number of protrusions in another embodiment. Moreover, although the protrusions of FIGS. 6 and 7 have a rectangular shape in cross-sectional view, end portion of the protrusions may have a round shape or an acute shape in another embodiment.

In a gas valve assembly according to the present invention, a direct contact of a gas and a magnetic fluid and a leakage of a magnetic fluid into a chamber of an ALD apparatus are prevented. Accordingly, a contamination of the chamber and a generation of particles in the chamber are prevented.

It will be apparent to those skilled in the art that various modifications and variations can be made in the gas valve assembly without departing from the spirit or scope of the invention. Thus, it is intended that the present invention covers the modifications and variations of this invention provided they come within the scope of the appended claims and their equivalents.

What is claimed is:

1. A gas valve assembly for a deposition apparatus, comprising:
   a driving shaft including a plurality of gas supply paths therein;
   a housing surrounding the driving shaft and including a plurality of through holes therein;
   a plurality of magnetic seal pairs between the driving shaft and the housing, the plurality of magnetic seal pairs including a magnetic fluid; and
   a leakage-preventing means between the driving shaft and the housing, the leakage-preventing means preventing a leakage of the magnetic fluid, wherein the leakage-preventing means includes a plurality of labyrinth seal pairs, and wherein each labyrinth seal pair is disposed between the corresponding magnetic seal pair and a gas passage from the corresponding through hole to the corresponding gas supply path.

2. The assembly according to claim 1, wherein the plurality of gas supply paths correspond to the plurality of through holes and the plurality of magnetic seal pairs.

3. The assembly according to claim 1, wherein each labyrinth seal pair includes at least one first protrusion extending from the driving shaft and at least one second protrusion extending from the housing.

4. The assembly according to claim 3, wherein the driving shaft has a columnar shape, the housing has a cylindrical shape, and the at least one first protrusion and the at least one second protrusion have a ring shape.

5. The assembly according to claim 3, wherein the at least one first protrusion alternates with the at least one second protrusion.

6. The assembly according to claim 3, wherein the at least one first protrusion and the at least one second protrusion are spaced apart from each other.

7. The assembly according to claim 2, wherein one end of each gas supply path is disposed between the corresponding magnetic seal pair.

8. The assembly according to claim 2, wherein one end of each through hole is disposed between the corresponding magnetic seal pair.

9. The assembly according to claim 3, wherein the at least one first protrusion and the at least second protrusion have a winding gap therebetween.

10. A gas valve assembly for a deposition apparatus, comprising:
    a driving shaft including a first gas supply path and a second gas supply path;
    a housing surrounding the driving shaft and including a first through hole corresponding to the first gas supply path and a second through hole corresponding to the second gas supply path;
    a first pair of magnetic seals disposed between the driving shaft and the housing, a first one of the first pair of magnetic seals disposed above the first through hole and a second one of the first pair of magnetic seals disposed below the first through hole, wherein the first pair of magnetic seals includes a magnetic fluid;
    a second pair of magnetic seals disposed between the driving shaft and the housing, a first one of the second pair of magnetic seals disposed above the second through hole and a second one of the second pair of magnetic seals disposed below the second through hole, wherein the second pair of magnetic seals includes a magnetic fluid;
    a first set of separating means disposed between the driving shaft and the housing and further disposed between the first pair of magnetic seals, the first set of separating means positioned such that a first gas supplied through the first through hole enters the first supply path during a first rotational position of the driving shaft;
    a second set of separating means disposed between the driving shaft and the housing and further disposed between the second pair of magnetic seals, the second set of separating means positioned such that a second gas supplied through the second through hole enters the second supply path during a second rotational position of the driving shaft; and
    a leakage-preventing means disposed between the driving shaft and the housing, the leakage-preventing means preventing a leakage of the magnetic fluid.

11. The gas valve assembly of claim 10, wherein the first rotational position of the driving shaft does not overlap with the second rotational position of the driving shaft such that the first gas is not supplied to the first supply path at the same time that the second gas is supplied to the second supply path.

12. The gas valve assembly of claim 10, wherein the leakage-preventing means comprises:
    a first pair of labyrinth seals disposed between the first pair of magnetic seals and the first through hole; and
    a second pair of labyrinth seals disposed between the second pair of magnetic seals and the second through hole.

* * * * *

UNITED STATES PATENT AND TRADEMARK OFFICE
CERTIFICATE OF CORRECTION

PATENT NO. : 7,381,274 B2  Page 1 of 1
APPLICATION NO. : 10/870598
DATED : June 3, 2008
INVENTOR(S) : Sang-Gon Lee It is certified that error appears in the above-identified patent and that said Letters Patent is hereby corrected as shown below:

On the title page, item [73]
Assignee's name "Jusung Engineering Col, Ltd." should read --Jusung Engineering Co., Ltd.--.

Column 7, line 56, the word "altemates" should read --alternates--.

Signed and Sealed this

Second Day of September, 2008

JON W. DUDAS
*Director of the United States Patent and Trademark Office*